United States Patent
Teeter et al.

(10) Patent No.: US 7,414,234 B1
(45) Date of Patent: Aug. 19, 2008

(54) MEASUREMENT OF BURST MODE OPTICAL POWER OVER MULTIPLE BURSTS

(75) Inventors: Jason Teeter, Apex, NC (US); Rodger Dalton, Wake Forest, NC (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 11/670,694

(22) Filed: Feb. 2, 2007

(51) Int. Cl.
| G01J 1/44 | (2006.01) |
| H01J 40/14 | (2006.01) |
| H03F 3/08 | (2006.01) |
| H04B 10/06 | (2006.01) |

(52) U.S. Cl. .............. 250/214 R; 250/214 A; 398/202; 398/209

(58) Field of Classification Search .......... 250/214 A, 250/214.1, 214 R, 214 VT, 214 AL, 214 B; 327/345, 514; 359/153, 154, 142, 143, 189
See application file for complete search history.

(56) References Cited

U.S. PATENT DOCUMENTS

| 5,818,620 A | * | 10/1998 | Akimoto et al. ............. 398/209 |
| 6,456,141 B1 | * | 9/2002 | Nishizono et al. ........... 327/345 |
| 6,476,954 B1 | * | 11/2002 | Nishizono .................... 398/202 |
| 7,158,729 B2 | * | 1/2007 | Yokomizo .................... 398/202 |
| 2003/0123168 A1 | * | 7/2003 | Yokomizo .................... 359/896 |

* cited by examiner

*Primary Examiner*—Georgia Y. Epps
*Assistant Examiner*—Jennifer Bennett

(57) ABSTRACT

A system, method, and computer readable medium for measurement of burst mode optical power over multiple bursts, comprises mirroring a photodiode current of an optical signal burst, converting the mirrored photodiode current to a capacitor voltage, comparing the capacitor voltage to a pre-determined threshold voltage, and accumulating a burst time necessary for the capacitor voltage to reach the pre-determined threshold voltage.

20 Claims, 3 Drawing Sheets

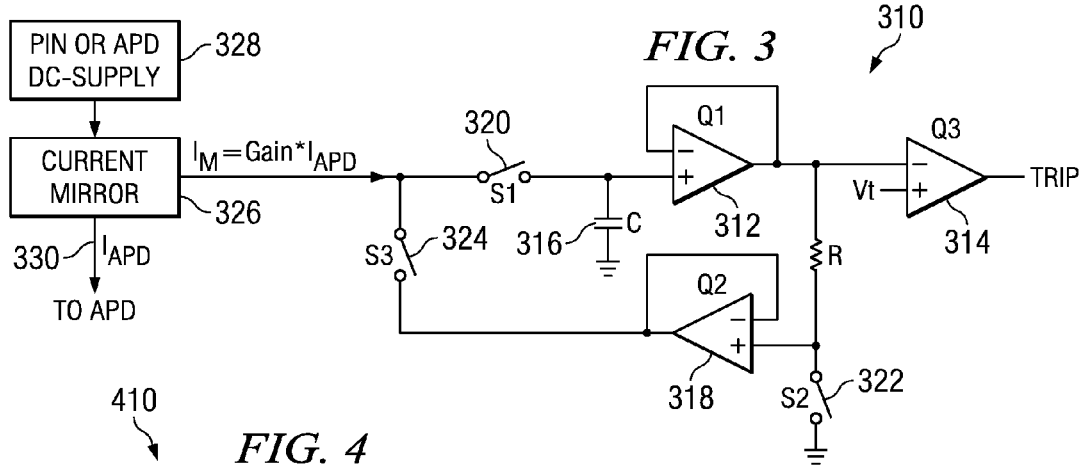
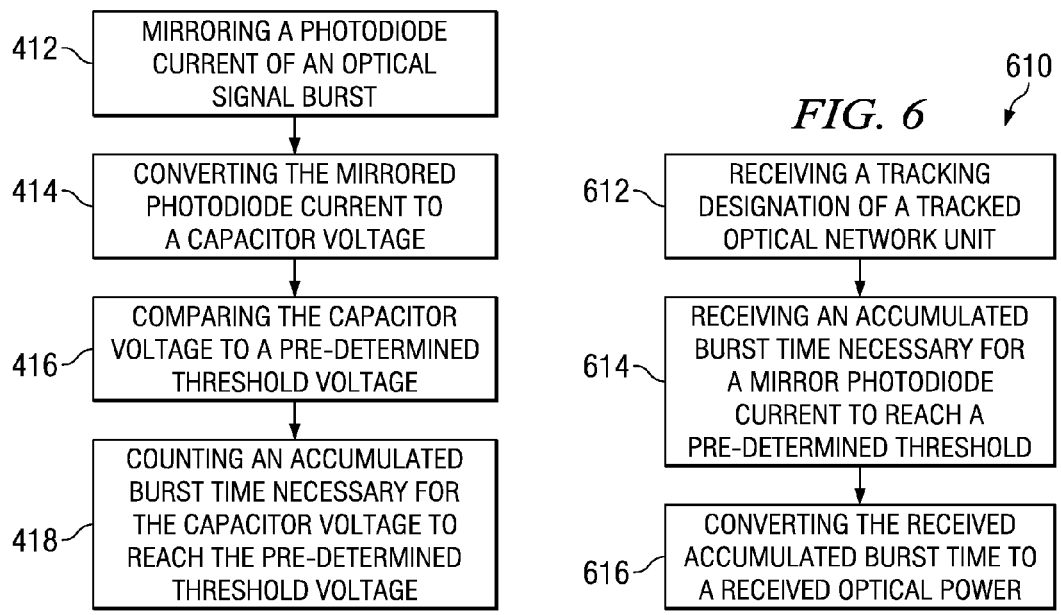
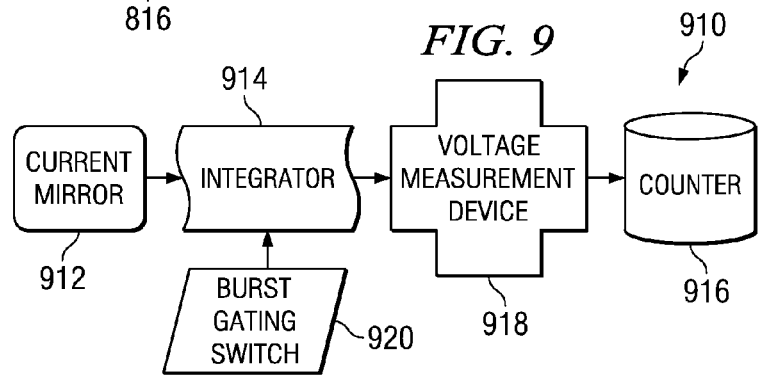

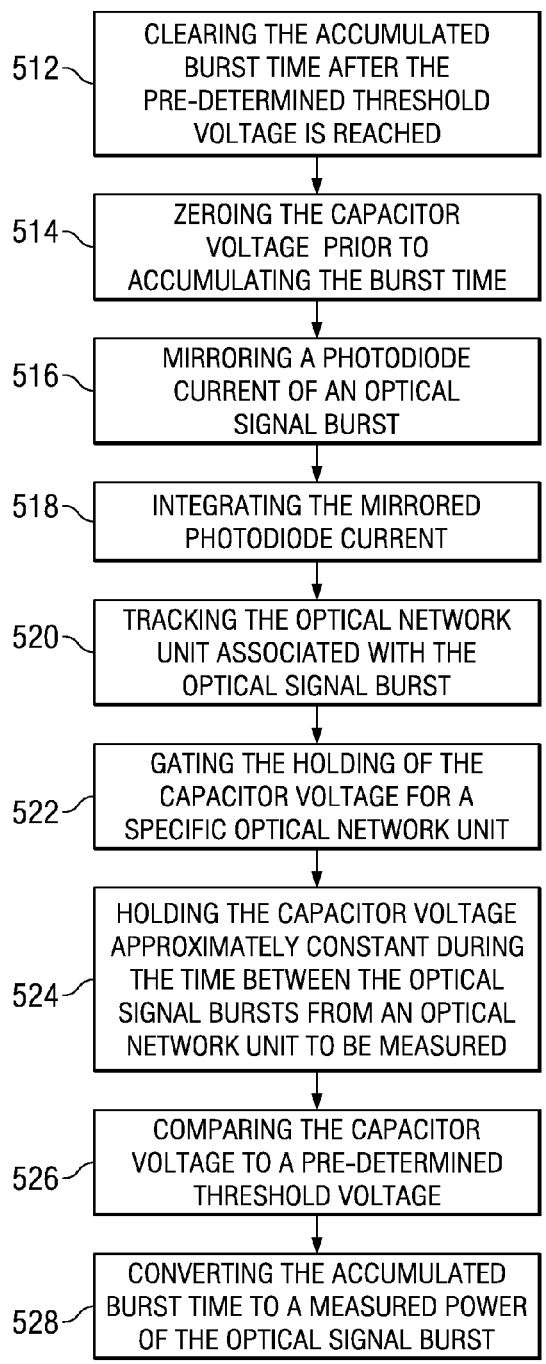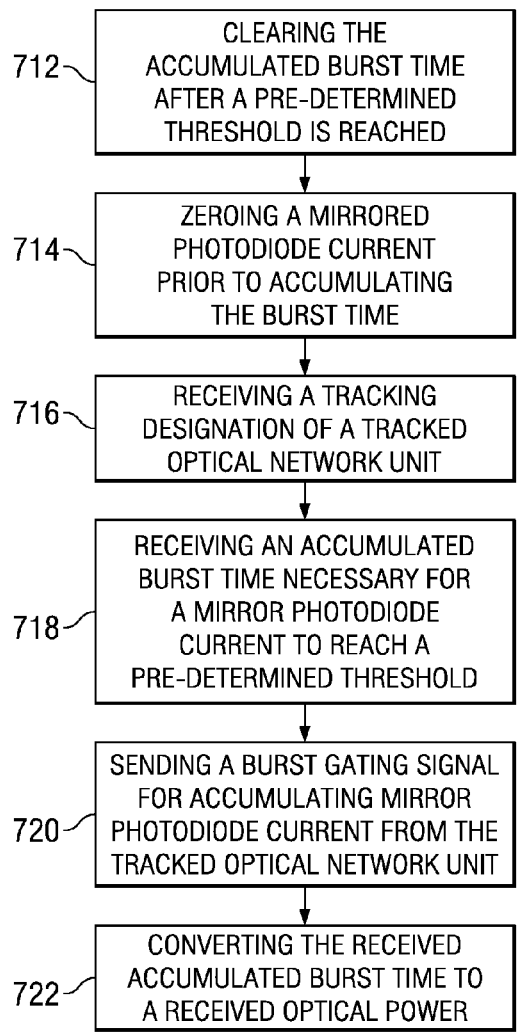

MEASUREMENT OF BURST MODE OPTICAL POWER OVER MULTIPLE BURSTS

CROSS REFERENCE TO RELATED APPLICATIONS

The present patent application is related to patent application Ser. No. 11/189,291 filed on Jul. 26, 2005, entitled METHOD AND SYSTEM FOR FACILITIATING BURST-MODE OPTICAL POWER MEASUREMENT, the entire contents of which is incorporated by reference herein, and which is assigned to the assignee of the present invention.

BACKGROUND OF THE INVENTION

The embodiment of the disclosure is generally related to optical power measurement in a passive optical network and, more specifically to a technique that allows optical power measurement to be performed under burst-mode conditions over a wide range of power levels by accumulating the measurement over multiple upstream bursts in a passive optical network.

A Passive Optical Network (PON) consists of an Optical Line Terminator (OLT), which resides in a Central Office (CO). The optical line terminator services a number of Optical Network Units (ONUs) which reside at a premise of an end user of the service. The ONUs are typically connected to the PON in a star arrangement using passive optical splitters. The upstream data on the PON going from the ONUs to the OLT is time division multiplexed. Since each optical network unit may be located at a different distance from the optical line terminator, the amplitude of the upstream signal, seen at the optical line terminator, varies between optical network units. The ability to accurately and non-intrusively measure upstream power for each optical network unit has many applications such as monitoring ONU laser wear over time, detection of rogue ONUs and optical power leveling between the ONUs.

Two key benefits provided by the embodiment of the disclosure are increased measurement accuracy when the input optical power is low in addition to solving the problem of increased latency associated with low input power. For a typical prior art a very long duration upstream burst would need to be scheduled to make an accurate measurement, since the prior art involves use of a log amp and the nature of the log amp results in slow response at low input levels. Log amps are typically used to measure signal strength since they have an output function that is the log of the input function. The log amp response time depends on input signal level; therefore at low input signals the response can be very slow. The ITU standard for GPON (G.984) only allows for a maximum upstream burst size of 125 microseconds. This in effect places a hard lower limit on the optical power level that can be measured with conventional continuous-mode RSSI circuitry. This hard lower limit does not cover the full range of optical power levels at which the system is expected to operate. A further complication is that scheduling extremely long upstream bursts to accommodate conventional RSSI circuits is very disruptive to the quality of service requirements for the upstream data traffic and wastes bandwidth. With the multi-burst approach of the embodiment of the disclosure the measurement is accumulated over several small naturally occurring upstream cells, thus no special RSSI burst scheduling is required which might disrupt the normal traffic flows reducing bandwidth.

Some conventional solutions provide an output voltage that is linearly proportional to the average input photodiode current. These approaches have limited dynamic range since the resulting output voltage is on the order of several volts at the high end of the input optical power range and only a few millivolts at the low end of the input optical power range. If this output voltage is referenced to ground potential, great care is required in the circuit implementation to overcome effects such as noise and offset voltages. In addition, the Analog to Digital Converter (ADC) used to measure the voltage must have very high resolution in order to meet the accuracy requirement at low power levels while still being able to measure the voltage when the input optical power is high. High ADC resolution results in increased system cost as well as longer ADC conversion times which exacerbates the problem with measurement latency requiring even longer upstream bursts to be scheduled by the PON MAC. Logarithmic amplifiers can be employed to reduce the demand for high ADC resolution, but they substantially increase the measurement latency as explained in the previous paragraph.

Therefore, what is needed is a non-intrusive method for measuring optical input power for the purposes of monitoring optical system conditions and allowing the optical system equipment to adjust system parameters during normal operation in order to improve system performance. Implementing such a measurement methodology for new optical network technologies such as GPON (defined in ITU-T Recommendation G.984) requires a measurement technique with wide dynamic range and greater accuracy than is offered by existing solutions.

SUMMARY OF THE INVENTION

The embodiment of the disclosure utilizes a current mirror to provide a copy of the primary photodetector (typically a PIN or APD photodiode) current to the RSSI circuit so that the measurement can be performed without affecting the normal data path. The mirrored current is fed into a switched capacitor circuit that converts the current into a voltage. The accumulation capacitor voltage is connected to a high impedance comparator that detects when the capacitor voltage exceeds an adjustable threshold.

The embodiment of the disclosure utilizes a gating signal from the PON MAC that controls when the mirrored photocurrent is allowed to charge the capacitor. In this way, the photocurrent only charges the capacitor during upstream data packets coming from the ONU to be measured. This allows the measurement to be taken over multiple naturally occurring bursts from the ONU without regard to burst lengths or burst frequency. In this way, no special scheduling is required by the MAC, just an indication to the circuit of when the ONU to be measured is actively transmitting upstream.

The embodiment of the disclosure utilizes a digital counter, which increments only when the measured ONU is transmitting, to determine the cumulative amount of time required for the capacitor circuit to reach the preset voltage threshold. Since the capacitor size and voltage threshold are known, the photocurrent can be calculated using the simple relation I=C dV/dt and the optical input power can be calculated based on the known optical to electrical gain of the photodiode. In the actual implementation, more sophistication might be needed than the simple relation shown above as non-ideal effects such as leakage currents and photodetector gain variations must be accounted for.

In one embodiment of the disclosure, a method for measurement of burst mode optical power over multiple bursts, that comprises mirroring a photodiode current of an optical signal burst, converting the mirrored photodiode current to a capacitor voltage, comparing the capacitor voltage to a pre-determined threshold voltage, and accumulating the burst time necessary for the capacitor voltage to reach the pre-determined threshold voltage.

In a further embodiment of the disclosure, a computer readable medium that comprises instructions for, receiving a tracking designation of a tracked optical network unit, receiving an accumulated burst time necessary for a mirror photodiode current to reach a pre-determined threshold, and converting the received accumulated burst time to a received optical power.

In yet a further embodiment of the disclosure, a system of measurement of burst mode optical power over multiple bursts, that comprises, a current mirror for mirroring a photodiode current of an optical signal burst from an optical network unit, an integrator coupled to the current mirror for converting the mirror current to an integrated voltage, and a counter coupled to the integrator for accumulating the burst time necessary for the integrated voltage to reach a pre-determined threshold voltage.

BRIEF DESCRIPTION OF THE DRAWINGS

FIG. 3 illustrates a second system of an embodiment of the disclosure as a portion thereof;

FIG. 4 illustrates a first method flow diagram listing the method steps of the method of operation of an embodiment of the disclosure;

FIG. 5 illustrates a second method flow diagram listing the method steps of the method of operation of an embodiment of the disclosure;

FIG. 6 illustrates a first software flow diagram in accordance with an embodiment of the disclosure;

FIG. 7 illustrates a second software flow diagram in accordance with an embodiment of the disclosure;

FIG. 8 illustrates a third system of measurement of burst mode optical power over multiple bursts in accordance with an embodiment of the disclosure; and FIG. 9 illustrates a fourth system of measurement of burst mode optical power over multiple bursts in accordance with an embodiment of the disclosure.

DETAILED DESCRIPTION OF THE INVENTION

Figure 1:
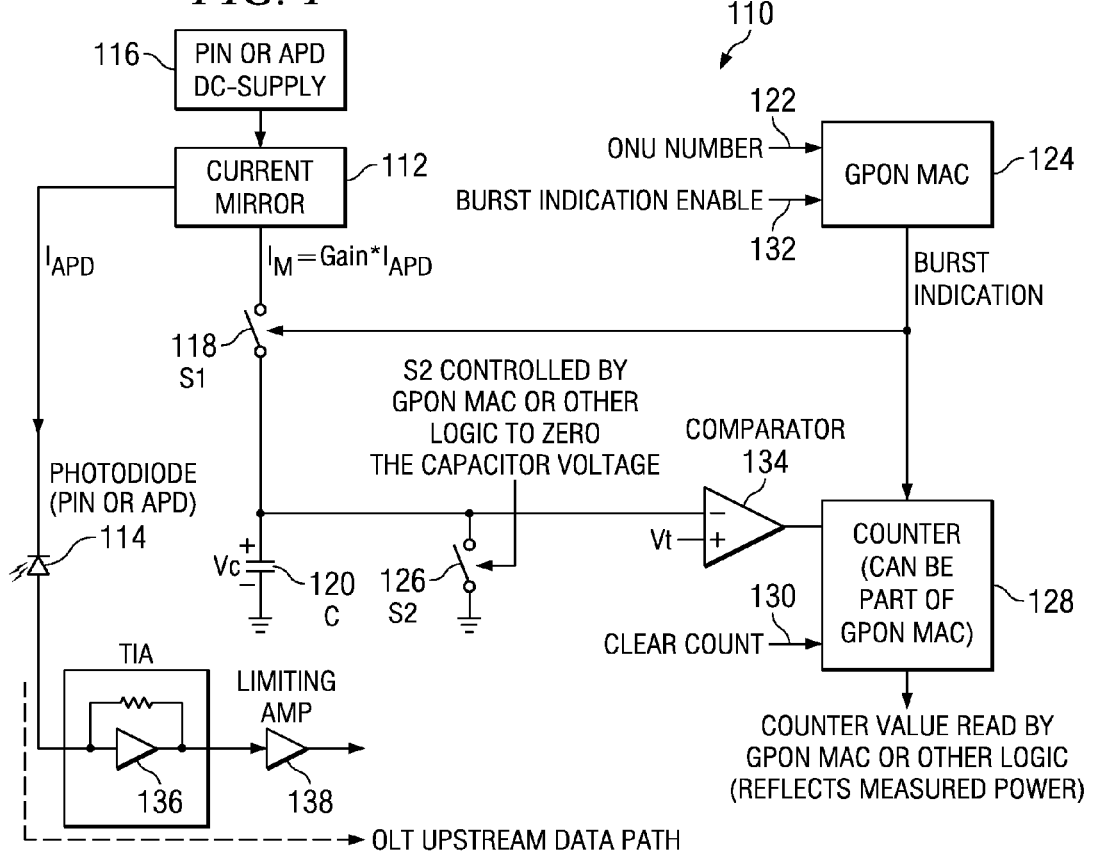
FIG. 1 illustrates a first system of an embodiment of the disclosure as a portion thereof.

Referring to FIG. 1, a system 110 for measuring burst-mode optical power over multiple bursts is depicted and comprises a number of blocks or modules that are software, hardware, or firmware, and/or the combination of software, hardware, and/or firmware.

A Current Mirror (CM) 112 is used between the photodiode 114 and its DC bias voltage 116 so that the current used by the photodiode and DC current load is replicated (with some attenuation or gain) at the current mirror output. This output is connected to the input of a switched 118 capacitor circuit 120 which converts input current to voltage in a linear fashion based on the relationship I=C dV/dt.

The PON ID number of the ONU to be measured ("N") 122 is set in a MAC 124 register. Switch S2 126 is closed for a specific duration in order to zero the capacitor voltage. The burst time counter 128 is cleared to zero 130. The MAC burst indication output is then enabled 132 so that upstream bursts from ONU N cause switch S1 to be closed and causes the burst time counter to increment during the times when ONU N is transmitting upstream. When S1 is closed, mirrored current flows into capacitor C and increases the capacitor voltage Vc at a rate proportional to the current. Switch S1 is closed only when the ONU to be measured (ONU with PON ID number "N") is actively transmitting upstream. The burst time counter is only allowed to increment when S1 is closed. When S1 is open, no current flows into the accumulation capacitor so its voltage will remain approximately constant. When S1 closes at the start of the next burst from ONU N, the capacitor voltage will increase starting at the previous stored value. (Ref to FIG. 2) When the capacitor voltage reaches a preset threshold Vt (determined by the bias level of the positive comparator input) the comparator 134 output changes from high to low which immediately halts the burst time counter and signals the system that the measurement is complete.

The relationship between burst time count ($\Delta T$) and power in dBm is then:

$$P_{in}(dBm) = 10 \times \log_{10}(A \times C \times Vt / \Delta T)$$

Where A is a constant which accounts for the photodiode gain, photodiode response, current mirror gain and counter time base. The value of A can be calculated or measured and stored when the OLT is calibrated. The logarithm function can be implemented as a lookup table or any other algorithm available to the OLT. In other embodiments, more sophisticated lookup tables are used to account for leakage currents, variation in photodetector gain and variations due to temperature effects.

Figure 2:
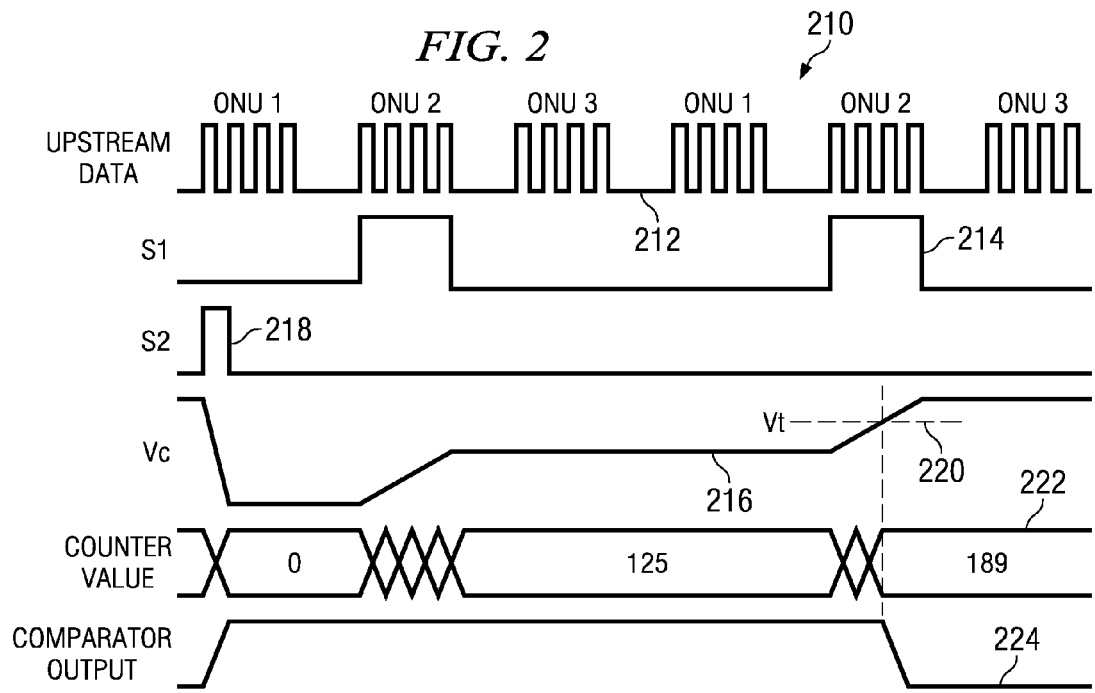
FIG. 2 illustrates a timing diagram of an embodiment of the disclosure as a portion thereof.

Referring to FIG. 2, a timing diagram for measuring burst-mode optical power over multiple bursts 210 is depicted. This figure is preferably used in conjunction with FIG. 1. As can be seen, the upstream data is coming from multiple ONUs 212, and a switch S1 214 is connected to Vc 216. Switch S2 218 zeroes Vc so that a power measurement can be initiated. As switch S1 is activated for the ONU of interest, the counter increments until a threshold voltage Vt 220 is reached at which point the comparator output 224 drops in voltage and the counter value 222 is latched.

FIG. 3 depicts a second system 310 showing a more detailed example of the circuitry that can be used to implement the switched capacitor function.

In the figure, Q1 312 is an operational amplifier (op-amp) with low input leakage current and Q3 314 is a fast comparator. The comparator could include internal or external hysteresis circuitry (not shown) to minimize chatter on the output since the input can exhibit a very slow rate of increase. The operational amplifier Q1 312 isolates capacitor C 316 from the rest of the circuit to minimize the number of connections and resulting leakage. Q1 312 and Q2 318 are each connected as a voltage follower which buffers the input voltage to the output.

Switch S1 320 and S2 322 behave as described earlier except S2 is no longer directly connected across the capacitor. To reset (zero) the capacitor voltage, all switches (S1/S2/S3 324) are closed and Q2 sinks current to discharge the capacitor. Note that when this is done the current mirror 326 output node is also driven low. Therefore Q2 sinks both the capacitor current and whatever current flows from the current mirror. The current mirror is connected to a DC power supply 328. The current mirror, provides a gain scaled copy of the primary photocurrent, Iapd 330. The actual voltage at Q2's output during the reset will be slightly above zero due to the output impedance of the op-amp. This voltage is expected to be on the order of tens of millivolts worst-case which should not appreciably affect the accuracy of the measurement.

Q2 prevents transient current from flowing into the capacitor when S1 is closed. When the ONU is not transmitting, S1 is open and S3 is closed. This causes the capacitor voltage value to be buffered through Q1 and Q2 so that the current mirror output node is held at the capacitor voltage value and there is no voltage difference across S1. When the ONU being measured is transmitting a burst, S1 is closed and S3 is open so that the current mirror outputs current charges C as desired. All switches can be controlled by the GPON MAC which schedules the upstream bursts.

Calibration can be performed in order to compensate for leakage, tolerances, voltage offsets and other non-ideal behavior if these phenomena have too great of an impact on accuracy.

The voltage threshold (Vt) can be set with a voltage divider, shunt regulator, digital-to-analog converter (DAC) or any other suitable means. Use of a DAC allows the threshold to be programmable in case additional flexibility is desired. Variation of the threshold accuracy over temperature should be considered.

Referring now to FIG. 4, a first method of measurement of burst mode optical power over multiple bursts 410 is depicted and comprises a number of blocks or modules that are software, hardware, or firmware, and/or the combination of software, hardware, and/or firmware. A method for measurement of burst mode optical power over multiple bursts, comprises, mirroring 412 a photodiode current of an optical signal burst, converting 414 the mirrored photodiode current to a capacitor voltage, comparing 416 the capacitor voltage to a pre-determined threshold voltage, and counting 418 an accumulated burst time necessary for the capacitor voltage to reach the pre-determined threshold voltage. The transfer of information between the modules occurs via at least one of: a wireless protocol, a wired protocol and a combination of the wireless protocol and the wired protocol.

Referring now to FIG. 5, a second method of measurement of burst mode optical power over multiple bursts 510 is depicted and comprises a number of blocks or modules that are software, hardware, or firmware, and/or the combination of software, hardware, and/or firmware. A method for measurement of burst mode optical power over multiple bursts, comprises, clearing 512 the accumulated burst time after the pre-determined threshold is reached, zeroing 514 the capacitor voltage prior to accumulating the burst time, mirroring 516 a photodiode current of an optical signal burst and integrating 518 the mirrored photodiode current. The method also comprises tracking 520 the optical network unit associated with the optical signal burst, gating 522 the holding of the capacitor voltage for a specific optical network unit and holding 524 the capacitor voltage approximately constant during the time between the optical signal bursts from an optical network unit to be measured. Additionally, the method comprises comparing 526 the capacitor voltage to a pre-determined threshold voltage and converting 528 the accumulated burst time to a measured power of the optical signal burst. The transfer of information between the modules occurs via at least one of: a wireless protocol, a wired protocol and a combination of the wireless protocol and the wired protocol.

Referring now to FIG. 6, a first software flow block 610 of measurement of burst mode optical power over multiple bursts is depicted. A computer readable medium comprises instructions for, receiving 612 a tracking designation of a tracked optical network unit, receiving 614 an accumulated burst time necessary for a mirror photodiode current to reach a pre-determined threshold, and converting 616 the received accumulated burst time to a received optical power. This method is preferably embodied in a computer readable medium or software but may also be embodied in firmware and is utilized via hardware. The transfer of information occurs via at least one of a wireless protocol, a wired protocol and the combination of the wireless protocol and the wired protocol. The steps performed in this figure may be performed by software, hardware, firmware, and/or the combination of software, hardware, and/or firmware.

Referring now to FIG. 7, a second software flow block 710 of measurement of burst mode optical power over multiple bursts is depicted. A computer readable medium comprises instructions for, clearing 712 an accumulated burst time after a pre-determined threshold is reached, zeroing 714 a mirrored photodiode current prior to accumulating the burst time, receiving 716 a tracking designation of a tracked optical network unit and receiving 718 an accumulated burst time necessary for the mirror photodiode current to reach the pre-determined threshold. The computer readable medium also comprises instructions for sending 720 a burst gating signal for accumulating mirror photodiode current from the tracked optical network unit, converting 722 the received accumulated burst time to a received optical power. This method is preferably embodied in a computer readable medium or software but may also be embodied in firmware and is utilized via hardware. The transfer of information occurs via at least one of a wireless protocol, a wired protocol and the combination of the wireless protocol and the wired protocol. The steps performed in this figure may be performed by software, hardware, firmware, and/or the combination of software, hardware, and/or firmware.

Referring now to FIG. 8, a third system 810 of measurement of burst mode optical power over multiple bursts is depicted. A system of measurement of burst mode optical power over multiple bursts, comprises, a current mirror 812 for mirroring a photodiode current of an optical signal burst from an optical network unit, an integrator 814 coupled to the current mirror for converting the mirror current to an integrated voltage, and a counter 816 coupled to the integrator for accumulating the burst time necessary for the integrated voltage to reach a pre-determined threshold voltage. The transfer of information between the processor and the memory occurs via at least one of a wireless protocol, a wired protocol and a combination of a wireless protocol and a wired protocol. The steps performed in this figure may be performed by software, hardware, firmware, and/or the combination of software, hardware, and/or firmware. Additionally, the processor and/or memory described herein form a circuit.

Referring now to FIG. 9, a fourth system 910 of measurement of burst mode optical power over multiple bursts is depicted. A system of measurement of burst mode optical power over multiple bursts, comprises, a current mirror 912 for mirroring a photodiode current of an optical signal burst from an optical network unit, an integrator 914 coupled to the current mirror for converting the mirror current to an integrated voltage, and a counter 916 coupled to the integrator for counting an accumulated burst time necessary for the integrated voltage to reach a pre-determined threshold voltage. The system may also comprise a voltage measurement device 918 coupled to the integrator and a burst gating switch 920 connected to the integrator for selectively integrating the mirror current from the optical network unit. Wherein the voltage measurement device is an analog to digital converter or the voltage measurement device is a comparator. The transfer of information between the processor and the memory occurs via at least one of a wireless protocol, a wired protocol and a combination of a wireless protocol and a wired protocol. The steps performed in this figure may be performed by software, hardware, firmware, and/or the combination of software, hardware, and/or firmware. Additionally, the processor and/or memory described herein form a circuit.

Although an exemplary embodiment of the system of the disclosure has been illustrated in the accompanied drawings and described in the foregoing detailed description, it will be understood that the embodiment of the disclosure is not limited to the embodiments disclosed, but is capable of numerous rearrangements, modifications, and substitutions without departing from the spirit of the embodiment of the disclosure as set forth and defined by the following claims. For example, the capabilities of the embodiment of the disclosure can be performed fully and/or partially by one or more GPON MACs. Also, these capabilities may be performed in the current manner or in a distributed manner and on, or via, any device able to provide and/or receive information. Further, although depicted in a particular manner, various modules or blocks may be repositioned without departing from the scope of the embodiment of the disclosure. Still further, although depicted in a particular manner, a greater or lesser number of modules and connections can be utilized with the disclosure in order to accomplish the embodiment of the disclosure, to provide additional known features to the embodiment of the disclosure, and/or to make the embodiment more efficient. Also, the information sent between various modules can be sent between the modules via at least one of a data network, the Internet, an Internet Protocol network, a wireless source, and a wired source and via plurality of protocols.

What is claimed is:

1. A method for measurement of burst mode optical power over multiple bursts, comprising:
   mirroring a photodiode current of an optical signal burst;
   converting the mirrored photodiode current to a capacitor voltage;
   comparing the capacitor voltage to a pre-determined threshold voltage; and
   accumulating a burst time necessary for the capacitor voltage to reach the pre-determined threshold voltage.

2. The method of claim 1 comprising:
   holding the capacitor voltage approximately constant during a time between the optical signal bursts from an optical network unit to be measured.

3. The method of claim 2 comprising:
   gating the holding of the capacitor voltage for a specific optical network unit.

4. The method of claim 1 comprising:
   integrating the mirrored photodiode current.

5. The method of claim 4 comprising:
   zeroing the integration prior to accumulating the burst time.

6. The method of claim 1 comprising:
   clearing the accumulated burst time after the pre-determined threshold voltage is met.

7. The method of claim 1 comprising:
   converting the accumulated burst time to a measured power of the optical signal burst.

8. The method of claim 1 comprising:
   tracking the optical network unit associated with the optical signal burst.

9. A computer readable medium comprising instructions for: receiving a tracking designation of a tracked optical network unit;
   receiving an accumulated burst time necessary for a mirror photodiode current to reach a pre-determined threshold; and
   converting the received accumulated burst time to a received optical power.

10. The computer readable medium of claim 9 wherein:
    sending a burst gating signal for integrating mirrored photodiode current for the tracked optical network unit.

11. The computer readable medium of claim 9 wherein:
    sending the converted received optical power to the tracked optical network unit.

12. The computer readable medium of claim 9 comprising instructions for:
    clearing the accumulated burst time before starting a measurement.

13. The computer readable medium of claim 9 comprising instructions for:
    zeroing the voltage of the integrating capacitor before starting a measurement.

14. The computer readable medium of claim 9 comprising instructions for:
    adjusting an optical power output of the tracked optical network unit in response to the converted received optical power.

15. A system of measurement of burst mode optical power over multiple bursts, comprising:
    a current mirror for mirroring a photodiode current of an optical signal burst from an optical network unit;
    an integrator coupled to the current mirror for converting a mirror current to an integrated voltage; and
    a counter coupled to the integrator for accumulating a burst time necessary for the integrated voltage to reach a pre-determined threshold voltage.

16. The system of claim 15 comprising:
    a voltage measurement device coupled to the integrator.

17. The system of claim 16 wherein:
    the voltage measurement device is an analog to digital converter.

18. The system of claim 16 wherein:
    the voltage measurement device is a comparator.

19. The system of claim 15 comprising:
    a burst gating switch connected to the integrator.

20. The system of claim 15 wherein:
    the mirror current is selectively integrated from the optical network unit.

* * * * *